(12) United States Patent
Stautner et al.

(10) Patent No.: US 10,670,189 B2
(45) Date of Patent: Jun. 2, 2020

(54) SYSTEMS AND METHODS FOR STORING AND DISTRIBUTING GASES

(71) Applicant: General Electric Company, Schenectady, NY (US)

(72) Inventors: Ernst Wolfgang Stautner, Niskayuna, NY (US); Paul St. Mark Shadforth Thompson, Stephentown, NY (US); Anbo Wu, Clifton Park, NY (US); Alexander Kagan, Guilderland, NY (US); Minfeng Xu, Ballston Lake, NY (US); Evangelos Trifon Laskaris, Schenectady, NY (US); Justin Michael Ricci, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/654,438

(22) Filed: Jul. 19, 2017

(65) Prior Publication Data
US 2019/0024846 A1    Jan. 24, 2019

(51) Int. Cl.
*F17C 7/00* (2006.01)
*F17C 13/04* (2006.01)
(Continued)

(52) U.S. Cl.
CPC .............. *F17C 7/00* (2013.01); *F17C 13/04* (2013.01); *G01R 33/3403* (2013.01);
(Continued)

(58) Field of Classification Search
CPC .... F17C 7/00; F17C 2205/0302; H01L 39/04; H01L 23/445
(Continued)

(56) References Cited

U.S. PATENT DOCUMENTS

| 4,350,017 A * | 9/1982 | Kneip | ..................... F17C 3/085 220/203.02 |
|---|---|---|---|
| 4,431,159 A | 2/1984 | Stubbs | |

(Continued)

FOREIGN PATENT DOCUMENTS

| JP | 10238696 A | * | 9/1998 |
| JP | 10238696 A | * | 9/1998 |

(Continued)

OTHER PUBLICATIONS

Amao, Tsutomu, JP 10238696 A, Aluminum Alloy High Pressure Container, and Its Manufacture, Sep. 1998, European Patent Office, English Translation.*

(Continued)

*Primary Examiner* — Steve S Tanenbaum

(74) *Attorney, Agent, or Firm* — Armstrong Teasdale LLP

(57) ABSTRACT

A system includes a storage tank storing gas. The storage tank includes a storage tank interface portion made from a first material. The system also includes a nozzle that includes a nozzle interface portion and a first portion. The first portion is made from a second material different from the first material. Additionally, the system includes a connection formed by coupling the storage tank interface portion and the nozzle interface portion to one another, and the connection is configured to maintain a leak rate of the gas equal to or less than $1\times10^{-4}$ standard cubic centimeters per second (std. cc/s).

15 Claims, 4 Drawing Sheets

(51) Int. Cl.
  *G01R 33/38* (2006.01)
  *G01R 33/34* (2006.01)
  *H01L 39/04* (2006.01)
  *H01L 23/44* (2006.01)
  *G01R 33/3815* (2006.01)

(52) U.S. Cl.
  CPC ... *G01R 33/34023* (2013.01); *G01R 33/3804* (2013.01); *H01L 23/445* (2013.01); *H01L 39/04* (2013.01); *F17C 2205/0302* (2013.01); *G01R 33/3815* (2013.01)

(58) Field of Classification Search
  USPC .......................................................... 62/51.1
  See application file for complete search history.

(56) References Cited

U.S. PATENT DOCUMENTS

| | | | | |
|---|---|---|---|---|
| 5,711,547 | A | * | 1/1998 | Blumenthal ........ B60R 21/264 222/5 |
| 7,156,257 | B2 | | 1/2007 | De La Serna |
| 7,270,257 | B2 | * | 9/2007 | Steel ................. B23K 20/1235 228/2.1 |
| 8,196,800 | B2 | | 6/2012 | Grooms et al. |
| 8,397,939 | B2 | | 3/2013 | Landeck et al. |
| 9,404,655 | B2 | | 8/2016 | Monga et al. |
| 2004/0096610 | A1 | | 5/2004 | Ramanathan et al. |
| 2008/0111322 | A1 | * | 5/2008 | Otsubo ................ F16L 55/1108 277/654 |
| 2008/0202127 | A1 | * | 8/2008 | Mukoyama ............ F25D 19/00 62/51.1 |
| 2011/0036848 | A1 | * | 2/2011 | Landeck .................. F17C 1/14 220/582 |
| 2011/0101982 | A1 | * | 5/2011 | Huang .................... F25D 19/00 324/318 |
| 2011/0210131 | A1 | * | 9/2011 | Shimizu .................... F17C 1/06 220/694 |
| 2014/0144866 | A1 | * | 5/2014 | Heo ....................... F17C 13/002 215/45 |
| 2014/0166671 | A1 | | 6/2014 | Downie et al. |
| 2014/0212681 | A1 | | 7/2014 | Cui et al. |

FOREIGN PATENT DOCUMENTS

| | | |
|---|---|---|
| JP | 2008038223 A | 2/2008 |
| JP | 2008101677 A | 5/2008 |

OTHER PUBLICATIONS

Amao, Tsutomu, JP 10238696 A, Aluminum Alloy High Pressure Container, and Its Manufacture, Sep. 1998, European Patent Office, English Translation (Year: 1998).*

Sahin, Mumin; "Joining of stainless-steel and aluminium materials by friction welding", The International Journal of Advanced Manufacturing Technology, vol. 41, Issue: 5, pp. 487-497, Mar. 2009.

* cited by examiner

SYSTEMS AND METHODS FOR STORING AND DISTRIBUTING GASES

BACKGROUND

The subject matter disclosed herein relates to the storage and distribution of cooling gases that are stored in storage tanks.

In numerous industrial and cryogenic cooling applications, various gases may be stored in storage tanks and used to supply and cool devices and systems. Depending on the application, certain temperatures and pressures of the gases may be used. In many cases, different gas storage and distribution systems may be used based on the temperature and pressure used for a given application. These different gas storage and distribution systems may use a variety of materials based on a number of factors, including cost, manufacturing standards, material properties, and so forth. Accordingly, there is a need for systems and methods that allow for cryogenic fluids to be stored and distributed at a wide range of temperatures and pressures, and which also allow for the use of different materials.

BRIEF DESCRIPTION

In one embodiment, a system includes a storage tank storing gas. The storage tank includes a storage tank interface portion made from a first material. The system also includes a nozzle that includes a nozzle interface portion and a first portion. The first portion is made from a second material different from the first material. Additionally, the system includes a connection formed by coupling the storage tank interface portion and the nozzle interface portion to one another, and the connection is configured to maintain a leak rate of the gas equal to or less than $1 \times 10^{-4}$ standard cubic centimeters per second (std. cc/s).

In another embodiment, a method includes providing a storage tank that stores gas and includes a storage tank interface portion that is made of a first material. The method also includes providing a nozzle that includes a nozzle interface portion and a first portion. The first portion is made from a second material that is different from the first material. The method also includes coupling the storage tank interface portion to the nozzle interface portion to form a connection such that a leak rate of the gas equal to or less than $1 \times 10^{-4}$ std. cc/s is maintained.

In yet another embodiment, a system includes a storage tank storing gas. The storage tank includes a storage tank interface portion made from a first material. The system also includes a nozzle that includes a nozzle interface portion and a first portion. The first portion is made from a second material different from the first material. Additionally, the system includes a connection formed by coupling the storage tank interface portion and the nozzle interface portion to one another, and the connection is configured to maintain a leak rate of the gas equal to or less than $1 \times 10^{-7}$ std. cc/s. Furthermore, the system includes a cooling system configured to receive the gas from the storage tank, and the cooling system is configured to use the gas to cool a magnetic resonance imaging system.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
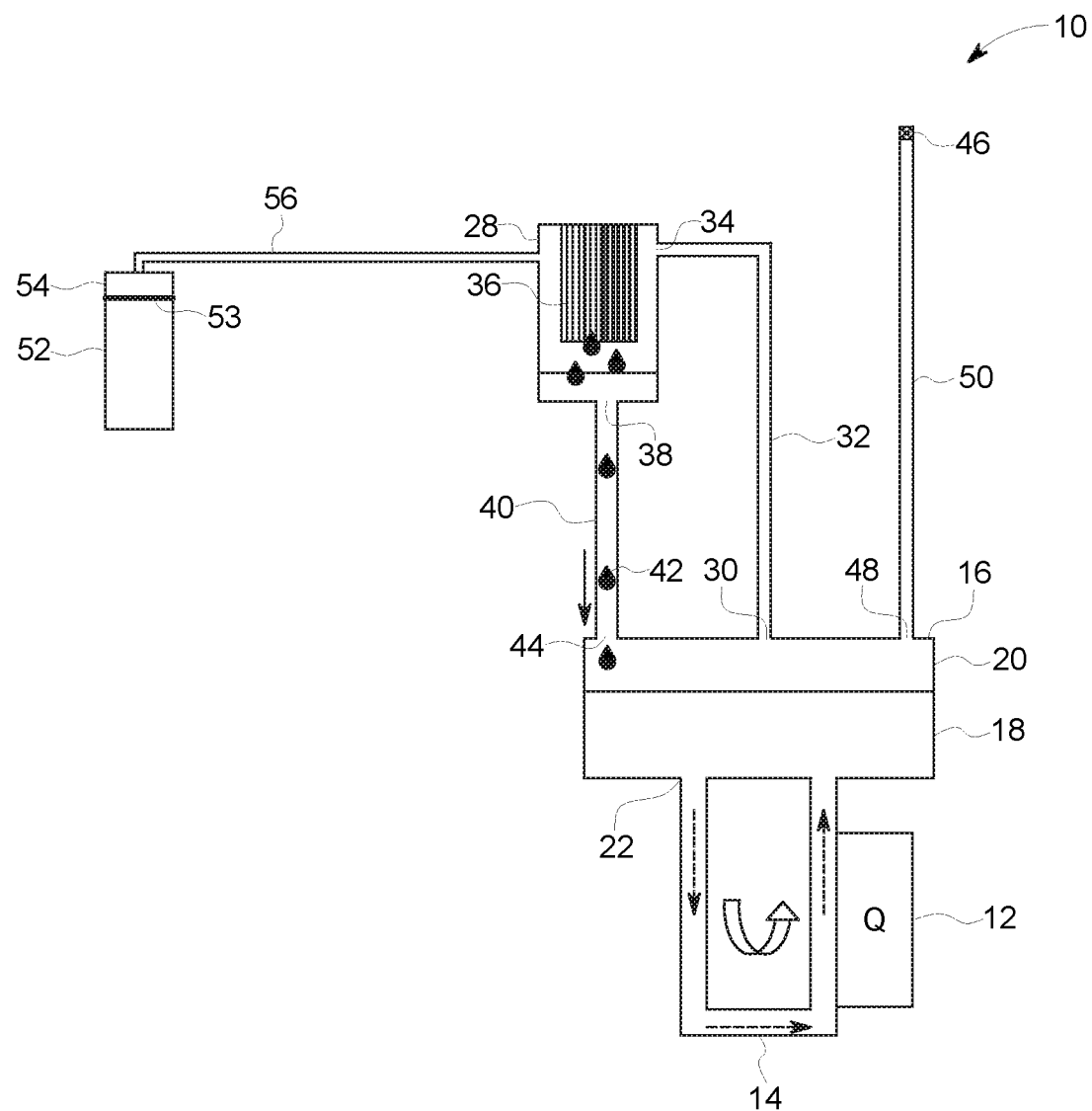
FIG. 1 is a block diagram of a thermosiphon cooling system that includes a cryogenic storage tank coupled to a nozzle in accordance with present embodiments.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

As used herein, the term "neck" refers to a portion of a storage tank (e.g., a gas cylinder) that can be considered to be a nozzle. However, as used herein, the term "nozzle" refers to a piece or fitting that may be coupled to the neck of a storage tank.

Cooling may be used in a variety of industrial and cryogenic applications. For example, cryogenic cooling may be used in nuclear magnetic resonance imaging spectroscopy, magnetic resonance imaging (MRI), nuclear fusion, accelerator magnet systems, forward-looking infrared systems, food storage, manufacturing processes, and recycling. In many cases, cooling is accomplished using fluids that are gases under standard temperature and pressure conditions. For example, many cooling applications involve the use of liquid helium and/or liquid nitrogen. In many cases involving cooling, fluids are stored in storage tanks or vessels, and the fluids are later distributed or removed to be used to cool a system or a component of a system. However, in many cases, different storage and removal techniques are used depending on the temperature and pressure of the gas used in a given system. In other words, depending on the application, the cooling fluid may be stored at a different temperature and/or pressure than the cooling fluid would be stored at if used for another application. What this means from a practical perspective, is that there are a number of different configurations for cooling fluid storage vessels and cooling fluid distribution systems. These different configurations may use different materials, different fittings, and so forth. In addition, cooling fluids may be stored at temperatures ranging from 328 K to 30 K, and at pressures up to 3600 pounds per square inch (psi) (about 245 atmospheres (atm)). At relatively colder temperatures and higher pressures, the differences in materials can become apparent through the failure of certain connections, resulting in fluid leakage. Thus, in some situations, cooling fluid may leak from storage tanks at rates that exceed an acceptable leak rate for a particular application. The present disclosure provides systems and methods that allow for cooling fluids to be stored in and removed from storage tanks at a range of temperatures and pressures and which allow for couplings between cooling system components to be made in a manner that maintains leakage of the cooling fluids at or below an acceptable rate.

Keeping the foregoing in mind, particularly that the systems and methods described below may be used for a wide variety of cooling applications, FIG. 1 is a schematic diagram of a thermosiphon cooling system 10 that may be used to cool a superconducting unit 12 of a magnetic resonance imaging (MRI) system. However, it should be noted that the implementation of the thermosiphon cooling system 10 is not limited to MRI systems, and may be implemented in other devices, such as superconducting electrical machines, superconducting magnet energy storage systems (SMES), superconducting (SC) accelerators, and the like. The thermosiphon cooling system 10 may be configured to maintain a temperature of the superconducting unit 12 at or below a cryogenic temperature. The superconducting unit 12 may include superconducting magnets and/or coils, a gradient system, and their supporting structure held within the MRI system. Particularly, the thermosiphon cooling system 10 is configured to cool or dissipate heat from the superconducting unit 12 so that the temperature associated with the superconducting unit 12 is maintained at or below the cryogenic temperature. The term cryogenic temperature is used to refer to a temperature at or below which the superconducting unit 12 is designed to operate in a superconducting state. In one embodiment, the cryogenic temperature may be in a range from about 3 K to about 5 K.

The thermosiphon cooling system 10 may include a tubing unit 14 configured to absorb heat generated by the superconducting unit 12. The tubing unit 14 may also include a liquid coolant, which may absorb heat from the tubing unit 14. The liquid coolant may include helium, hydrogen, neon, nitrogen, or combinations thereof. The liquid coolant may also be stored in a reservoir 16, which includes a first portion 18 that includes the liquid coolant and a second portion 20 that does not include the liquid coolant. The liquid coolant may exit the reservoir 16 via an outlet 22 to enter the tubing unit 14.

The liquid coolant in the first portion 18 of the reservoir 16 may absorb heat from the tubing unit 14. As the liquid coolant in the reservoir 16 absorbs heat from the tubing unit 14, some of the liquid coolant may evaporate, enter a condensing unit 28 in which the evaporated coolant is cooled such that the evaporated coolant condenses to become liquid coolant, and the liquid coolant may reenter the reservoir 16. More specifically, the evaporated coolant may exit the reservoir 16 via an outlet 30, travel through a channel 32, and exit the channel 32 via an outlet 34 into the condensing unit 28. The condensing unit 28 may include a condenser 36, and the condenser 36 may condense the evaporated coolant to form liquid coolant. The liquid coolant in the condensing unit 28 may exit the condensing unit 28 via an outlet 38, pass through a channel 40, and exit the channel 40 to enter the reservoir 16. As illustrated, the liquid coolant may form as droplets 42, and the droplets 42 may exit the channel 40 via outlet 44 and enter the reservoir 16.

Additionally, pressure in the reservoir 16 (e.g., caused by the evaporation of the liquid coolant) may be released via a release valve 46. That is, gas within the reservoir 16 may exit the reservoir 16 via an outlet 48, pass through a channel 50, and exit the channel 50 via the release valve 46.

Cryogenic gas (a cooling fluid) may be stored in a storage tank 52, and the cryogenic gas may be added to the condensing unit 28 via a nozzle 54 and a connector 56. A connection 53 may be formed between the storage tank 52 and the nozzle 54. That is, the storage tank 52 and the nozzle 54 may be two separate components that are joined via the connection 53. As discussed below, the connection 53 (e.g., between two different materials of the storage tank 52 and the nozzle 54) enables the cryogenic gas to be maintained within and transferred from the storage tank 52 in a leak-tight manner at very high pressures and over a wide temperature range (e.g., at pressures up to 3600 psi and temperatures between 30 K and 328 K). It should be noted that more than one storage tank 52 may be utilized to provide cryogenic gas to the tubing unit 14. In the illustrated embodiment, the cryogenic gas may be any of the same elements as the liquid coolant (e.g., helium, hydrogen, neon, nitrogen, or combinations thereof). In other embodiments, the cryogenic gas may be other fluids, such as compressed natural gas or liquefied natural gas.

The storage tank 52 may be made of aluminum (e.g., Al-6061), and the nozzle 54 may be made of aluminum, stainless steel (e.g., SS-316L), or a combination thereof. In other embodiments, the storage tank 52 may be made at least partially of stainless steel, and the nozzle 54 may be wholly or partially made of copper. The connector 56, which allows for cryogenic fluid to pass from the nozzle 54 and enter the tubing unit 14, may be made from stainless steel. However, in some embodiments, the storage tank 52 may be made of something other than aluminum (e.g., carbon fiber) or a combination of aluminum and another material (e.g., carbon fiber). In such embodiments, the storage tank 52 may include an aluminum lining within the storage tank 52, and a neck 58 of the storage tank 52 may also be made of aluminum. Additionally, in embodiments in which the storage tank 52 is made of aluminum and carbon fiber, the storage tank 52 may store the cryogenic gas at pressures of up to 10,000 psi.

The storage tank 52, when coupled to the nozzle 54 via the connection 53 may maintain leak rates at or below levels that are acceptable for various applications, including cryogenic applications. In other words, the connection 53 between the storage tank 52 and the nozzle 54 is such that the contents of the storage tank 52 (e.g., cryogenic gas) may only leak from the storage tank 52 at or below a rate that is acceptable for cryogenic and/or other applications, such as $1\times10^{-9}$ standard cubic centimeters per second (std. cc/s). As discussed below, the embodiments of the present disclosure allow for a leak rate that is at or below an acceptable leak rate for cryogenic applications.

Figure 2:
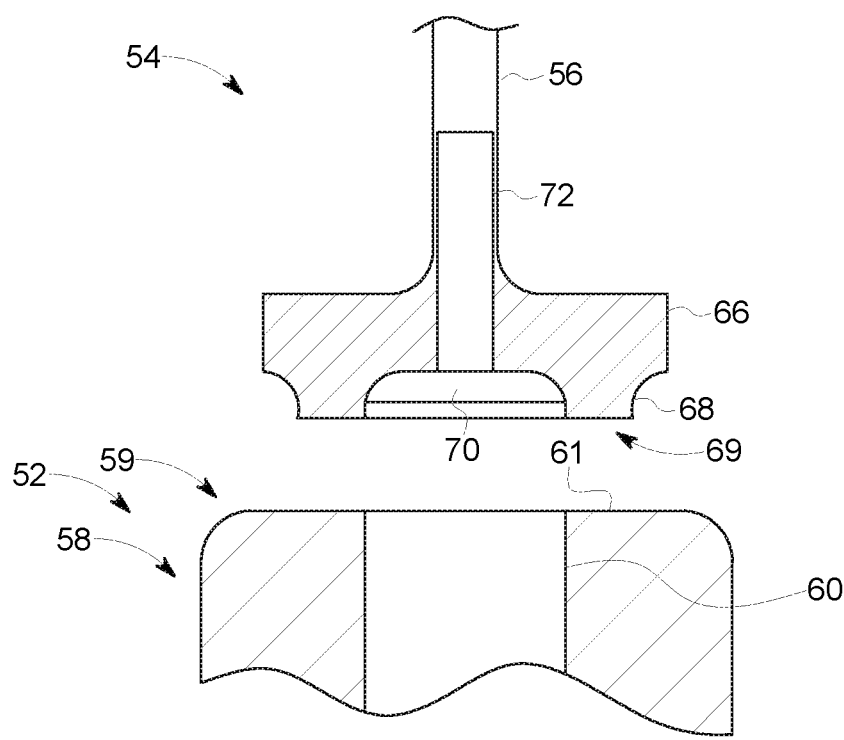
FIG. 2 is an expanded cross-sectional elevation view of an embodiment of a nozzle and a storage tank, in accordance with present embodiments.

With the foregoing discussion in mind, FIG. 2 is an expanded cross-sectional elevation view of an embodiment of the storage tank 52 and an embodiment of the nozzle 54 separated from one another. The storage tank 52 may be made of aluminum or a combination of aluminum and another material (e.g., carbon fiber). The storage tank 52 may also include a neck 58 to which the nozzle 54 may be coupled to form the connection 53 of FIG. 1.

As discussed below, the neck 58 and nozzle 54 may be coupled in a number of ways. Some of the methods for securing the nozzle 54 to the neck 58 (or other part of the storage tank 52) result in corresponding connections 53 that may perform better than others under certain conditions. For example, in accordance with this disclosure, the nozzle 54 may be secured to the storage tank 52 using friction welding, traditional welding techniques (e.g., stick welding, metal inert gas welding, or tungsten inert gas welding), threaded connections, or adhesives, among others. As will be apparent from this disclosure, such methods of securing the nozzle 54 to the storage tank 52 are not equivalent, with friction welding providing an overall more secure and leak-tight connection 53 compared to the other methods discussed herein.

As illustrated in FIG. 2, the storage tank 52 includes a storage tank interface portion 59 that is configured to interface with a corresponding portion of the nozzle 54. In some embodiments, the storage tank interface portion 59 may be formed at least partially within a channel 60 of the nozzle 54, while in other embodiments, the storage tank interface 59 may be formed along a top portion of the neck 58. The channel 60 is a portion of the neck 58 through which gas stored in the storage tank 52 may pass before exiting the storage tank 52 into the nozzle 54. The neck 58 may be made of a single material, such as aluminum, or a combination of materials, such as aluminum and carbon fiber.

The nozzle 54 may include a first portion 66 and a second portion 68. As described below, the nozzle 54 may be formed from a single material (e.g., stainless steel), in which case the first portion 66 and the second portion 68 are both made of the same single material and may therefore be integrated or monolithic. However, the nozzle 54 may be made from two or more parts that are coupled to one another. For instance, the first portion 66 and the second portion 68 may be two separate pieces which are coupled together (e.g., via welding such as friction welding). In embodiments in which the first portion 66 and the second portion 68 of the nozzle 54 are separate pieces that are coupled to one another, the first portion 66 and the second portion 68 may be made of the same material or from different materials. For example, the first portion 66 and the second portion 68 may both be made from stainless steel, or the first portion 66 may be made from stainless steel while the second portion 68 is made from a second material such as aluminum.

The nozzle 54 may also include an inner portion 70 that may interface with the channel 60 of the neck 58. For instance, the inner portion 70 may fit over and/or be aligned with the channel 60. In other words, the inner portion 70 may align with the channel 60 such that the inner portion 70 and channel 60 may be joined to form a passage through which gas may travel. Indeed, gas that exits the storage tank 52 may pass through the inner portion 70 and exit the nozzle 54 via an outlet section 72. The outlet section 72 may be coupled to a connector (e.g., connector 56), and the connector may be coupled to a target destination for the gas. For example, as discussed above in relation to FIG. 1, gas may exit the storage tank 52, pass through the nozzle 54 and the connector 56 and be delivered to the condensing unit 28 of thermosiphon cooling system 10.

The inner portion 70 and outlet section 72 may be made of the same material as other parts of the nozzle 54 or a different material than other parts of the nozzle 54. More specifically, in certain embodiments, the inner portion 70 and the outlet section 72 may be made from stainless steel, and other parts of the nozzle (e.g., the first portion 66 and the second portion 68) may be made from aluminum, stainless steel, or a combination of aluminum and stainless steel.

As set forth above, the nozzle 54 may be coupled to the storage tank 52 to form the connection 53 in several ways. For example, as mentioned above, the nozzle 54 may be coupled to the storage tank 52 via a threaded connection. More specifically, the channel 60 of the neck 58 may include threads or extensions that may interface with extensions or threads of the nozzle 54 to form a threaded connection. It should be noted that the threaded connection may also be supplemented using other coupling methods such as the use of adhesives (e.g., epoxy). Additionally, as discussed below, a gasket that interfaces with neck 58 and the nozzle 54 may also be included in embodiments in which the connection 53 is a threaded connection. In this regard, the storage tank interface portion 59 may interface with a nozzle interface portion 69 to form the connection 53. As described herein, the storage tank interface portion 59 and the nozzle interface portion 69 may be made of the same material (e.g., aluminum) or different materials (e.g., aluminum and stainless steel) and can be coupled to one another to form the connection 53.

Figure 3:
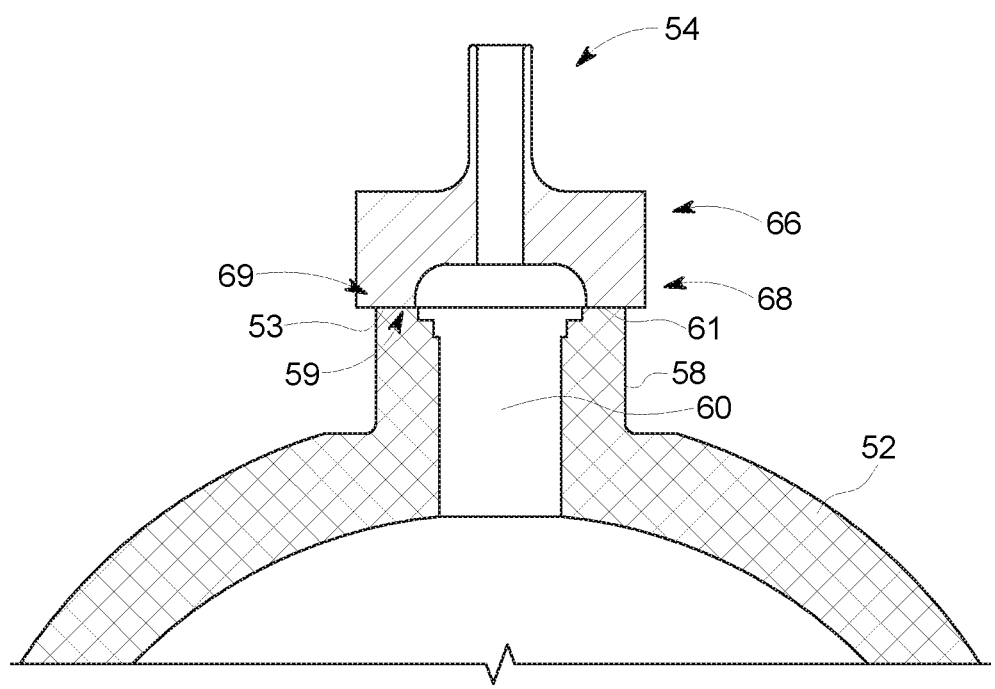
FIG. 3 is a cross-sectional elevation view of an embodiment of a nozzle and a storage tank in which the storage tank is coupled to the nozzle via welding, in accordance with present embodiments.

Keeping the discussion of FIG. 2 in mind, FIG. 3 is a cross-sectional elevation view of an embodiment of the storage tank 52 and an embodiment of the nozzle 54 in which the storage tank 52 is coupled to the nozzle 54 via welding. In the illustrated embodiment, the storage tank 52 is made from aluminum or carbon fiber that is lined with aluminum. The nozzle 54, which is made of stainless steel, is coupled to the storage tank 52 via friction welding to form an embodiment of the connection 53. Friction welding is a process in which heat is generated via mechanical friction between objects. For instance, one object may be spun rapidly while another object is held stationary. The stationary object may then be pressed against the rotating object to cause the two objects to fuse to one another. For example, in the present embodiment, the storage tank 52 may be the stationary object, the nozzle 54 may be rotated at a rotation rate (e.g., 250 to 500 rotations per minute (rpm)), and the storage tank 52 and nozzle 54 may be pressed together (e.g., with a pressure of 2500 to 3500 pounds per square inch (psi)).

As discussed above, the embodiment of the connection 53 that is illustrated in FIG. 3 can be formed via friction welding. In such an embodiment, the connection 53 may be formed at an interface between components of the storage tank 52 and the nozzle 54. In other words, in the embodiment of FIG. 3, the weld that forms the connection 53 may be formed at an interface between the storage tank interface portion 59 and the nozzle interface portion 69. For instance, the interface (i.e., the location where the connection 53 is formed) may be formed between the second portion 68 of the nozzle 54 and the top surface 61 of the storage tank 52. It should be noted that the inner portion 70 may be friction welded as well (e.g., to the channel 60) to form part of interface.

Thus, in embodiments where the nozzle 54 is desirably stainless steel, at least a portion (e.g., the first portion 66 of the nozzle 54) that is above the resulting interface is made of stainless steel, while the storage tank 52 is made at least partially from aluminum. In other words, the storage tank interface portion 59, which may include the neck 58 and/or the top surface 61, may be coupled to the nozzle interface portion 69, which may include second portion 68, via friction welding to form the connection 53.

In comparison to traditional welding techniques (e.g., arc welding), friction welding results in a smaller heat affected zone. The heat affected zone refers to the area around the connection 53 that is not melted by welding but has potentially had its microstructure and/or certain properties altered (e.g., as a result of heat exposure during welding). The relatively smaller heat affected zone resulting from friction welding allows for the connection 53 to be more robust than a connection that may be obtained via traditional welding techniques.

Moreover, friction welding allows for leak-tight bonds (e.g., the connection 53) to be formed between the storage tanks 52 and the nozzles 54. For example, the connection 53 may have a relatively low porosity compared to bonds formed using other methods (e.g., other types of welding). For example, when a bonded component is made of aluminum or includes aluminum, heat-based bonding methods such as welding (including friction welding) may cause aluminum oxide ($Al_2O_3$) to form, which can cause an increase in the porosity of the bond. However, it is presently recognized that friction welding may cause less aluminum oxide to form compared to other types of welding (e.g., gas welding), which enables lower porosities (and thus, lower leak rates) to be obtained. Such leak-tight bonds enable the maintenance of leak rates to below certain defined thresholds, which may be useful for a wide variety of gas storage applications.

As an example, in cryogenic cooling (e.g., cooling in MRI systems), there are strict temperature, pressure, and leak rate parameters to satisfy to allow for proper cooling. For instance, gas may be stored at pressures up to 3600 psi (about 250 bar), temperatures between 30 K and 125 K, and standards may call for a leak rate of $1\times10-9$ std. cc/s or lower. The embodiment illustrated in FIG. 3 may satisfy these parameters. More specifically, the connection 53 may allow the storage tanks 52 to store gas at pressures up to 3600 psi, temperatures between 30 K and 350 K, and have a leak rate less than $1\times10-9$ std. cc/s.

Regarding leak rates, the storage tanks 52 coupled respectively to the nozzles 54 via the connection 53 may have leak rates that are $1\times10-10$ std. cc/s or lower. That is, the connection may enable the storage tanks 52 to maintain leak rates that are an order of magnitude (i.e., ten times) lower than the accepted standard parameter of $1\times10-9$ std. cc/s. Regarding the testing conditions utilized to obtain the leak rates, a storage tank 52 coupled to a nozzle 54 may be placed into a vacuum chamber. Gas (e.g., helium) is added to the storage tank 52 (e.g., via the nozzle 54 that may be coupled to a connector 56 that is connected to another storage tank positioned outside of the vacuum chamber that is storing the gas). A valve connected to the vacuum chamber is opened, a vacuum pump that is connected to the valve is then actuated to create a vacuum or near vacuum conditions, and the valve may be closed once such conditions have been obtained. A second valve that is connected to the vacuum chamber and leads to a leak detector can then be opened, and a leak rate may be measured by the leak detector. Furthermore, it should be noted that the leak rates of the embodiment of FIG. 3 may be lower than $1\times10^{-10}$ std. cc/s, but present testing limitations are such that $1\times10^{-10}$ std. cc/s is the lowest detectable value.

Now referring to any application in which gas storage may be used, the storage tanks 52 coupled to the nozzles 54 allow for gases to be stored at a wide range of temperatures with a minimal gas leak rate. More specifically, gases stored in the storage tanks 52 may be stored at temperatures ranging from about 30 K to 300 K (or higher). The friction welded connection 53 between the storage tanks 52 and the nozzles 54 may allow for changes in temperature to affect the leak rate to a lesser extent than with other coupling techniques. As a result, gases to be used for a variety of applications may be stored in one type of storage tank. That is, instead of storing gases used for different applications in different storage tanks due to the pressures and temperatures associated with the applications, the gas may be stored in the same type of storage tank when connections between the tanks 52 and nozzles 54 are made in accordance with the present disclosure.

Figure 4:
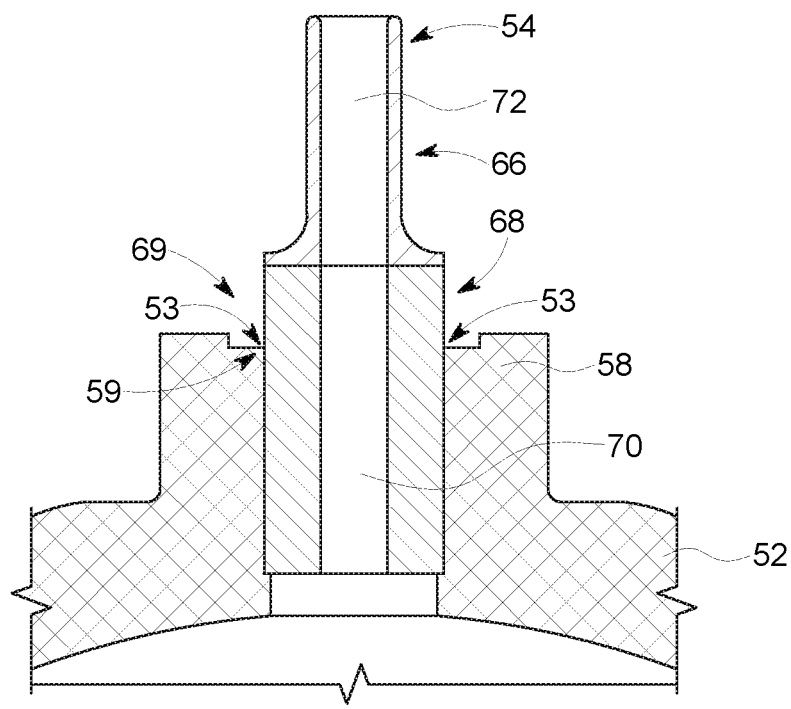
FIG. 4 is a cross-sectional elevation view of an embodiment of a nozzle and a storage tank in which the nozzle is bimetallic and is coupled to the storage tank via welding, in accordance with present embodiments.

In the alternative to forming the connection 53 via friction welding, traditional welding techniques may be used. FIG. 4 is a cross-sectional elevation view of an embodiment of a nozzle 54 and a storage tank 52 in which the nozzle 54 is bimetallic and is coupled to the storage tank 52 via welding to form the connection 53. That is, one of the ways in which the illustrated embodiment differs from the embodiment of FIG. 3 is that the nozzle 54 is made from two materials, stainless steel and aluminum. More specifically, a first portion 66 of the nozzle 54, which is made of stainless steel, may be welded (e.g., friction welded) to a second portion 68 of the nozzle 54, which is made of aluminum. The second portion 68 of the nozzle 54 may then be welded to the neck 58 of the storage tank 52 to form the connection 53.

Figure 5:
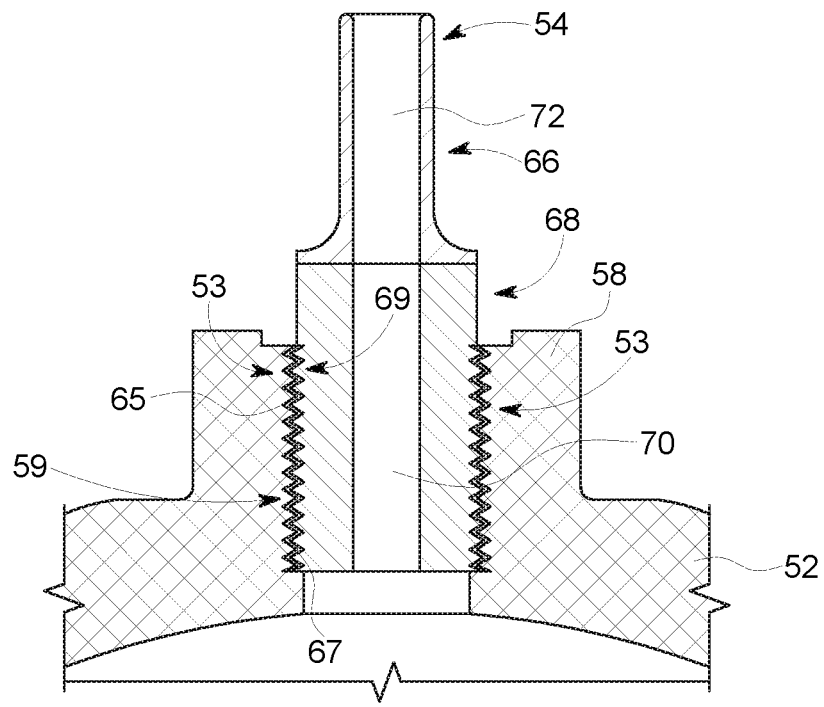
FIG. 5 is a cross-sectional view of an embodiment of a storage tank and a bimetallic nozzle that are configured to be coupled to one another via a threaded connection, in accordance with present embodiments.
Figure 6:
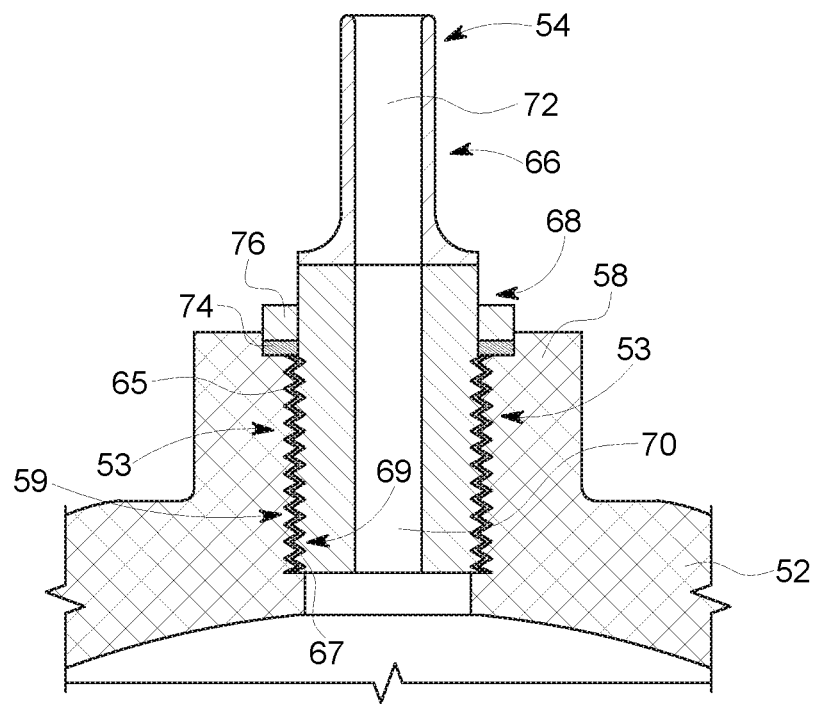
FIG. 6 is a cross-sectional view of an embodiment of a storage tank coupled to a nozzle via a threaded connection, in accordance with present embodiments.

As another alternative to using a welded connection between a storage tank and a nozzle, a threaded connection may be used. For instance, FIG. 5 is a cross-sectional view of an embodiment of the storage tank 52 and a bimetallic embodiment of the nozzle 54 that are configured to be coupled to one another via a threaded version of the connection 53. FIG. 6 is a cross-sectional view of another embodiment of the storage tank 52 that may be coupled to a bimetallic embodiment of the nozzle 54 via a threaded version of the connection 53, and a gasket 74 may interface the storage tank 52 and nozzle 54. While the embodiment of the nozzle 54 illustrated in FIG. 6 is bimetallic (e.g., made of aluminum and stainless steel), in other embodiments, the nozzle 54 may be made from a single metal (e.g., stainless steel). Referring to FIG. 5 and FIG. 6, the storage tanks 52 may be made of aluminum or a combination of aluminum and another material, such as carbon fiber.

A threaded version of the connection 53 may be formed between second portions 68 of the nozzles 54 and a neck 58 of the storage tanks 52. The second portions 68 may include threads or extensions 67 that may interface with extensions or threads 65 of the neck 58. For instance, the threads or extensions 67 of the second portion 68 as well as the extensions and threads 65 of the neck 58 may extend circumferentially about the second portions 68 and necks 58 and enable the second portions 68 and necks 58 to interface with one another. In other words, in the embodiments of FIG. 5 and FIG. 6, the storage tank interface portion 59 may include the extensions or threads 65 and any surface of the storage tank 52 that is configured to contact the nozzle 54 when the nozzle interface portion 69 is coupled to the storage tank interface portion 59 to form the connection 53. The nozzle interface portion 69 may include the threads or extensions 67 as well as any surface of the nozzle 54 that is configured to contact the storage tank 52 when the storage tank interface portion 59 is coupled to the nozzle interface portion 69. Additionally, an adhesive, such as epoxy, may be used in the threaded connection 53 to establish a more gas-tight connection 53 between the storage tanks 52 and the nozzles 54. A more gas-tight connection 53 may allow for a lower rate of gas that leaks from the storage tanks 52 compared to a threaded connection that does not include epoxy. Furthermore, it should be noted that other adhesives or sealants may be used instead of epoxy.

The threaded connection 53 may allow for inner portions 70 of the nozzles 54 to interface with the necks 58 of the storage tanks 52. For example, gas may exit the storage tanks 52 via an opening (e.g., the channel 60). Gas stored in the storage tanks 52 may pass through the opening and enter the inner portions 70, and exit the nozzles 54 via outlet sections 72. The outlet sections 72 may be coupled to connectors 56, which may allow for a connection to be established between the nozzles 54 and a target destination, such as a system to be cooled (e.g., thermosiphon cooling system 10).

In the embodiments of FIG. 5 and FIG. 6, the nozzle 54 may be made from more than one material. For instance, in the illustrated embodiment, the first portion 66 and the outlet section of the nozzle 54 may be made of one material (e.g., stainless steel), while the second portion 68 and the inner portion 70 are made of another material (e.g., aluminum). Additionally, the nozzle 54 may be formed from two pieces that are coupled to one another. For instance, the first portion 66 may be coupled to the second portion 68 via friction welding.

Furthermore, as shown in FIG. 6, a gasket 74 may be placed in between the storage tank 52 and the nozzle 54. The gasket 74, which may be included in any embodiments in which the storage tank 52 and nozzle 54 are coupled to one another via a threaded connection, may retain gas within the storage tank 52 and nozzle 54. For instance, the gasket 74 may form a seal between the storage tank 52 and the nozzle 54 by interfacing with the neck 58 of the storage tank 52 and the first portion of the nozzle 54 when the storage tank 52 and nozzle 54 are coupled to one another. The gasket 74 is generally ring-shaped, and may be made from various polymers such as polytetrafluoroethylene (PTFE), reinforced PTFE, and polychlorotrifluoroethylene (PCTFE). The gasket 74 may also be a seal (e.g., C-seal) that is made from metal or metal alloys (e.g., Inconel®). The gasket 74 may be held in place by extensions 76 of the nozzle 54 that may hold the gasket 74 in place. In other words, nozzle 54 may include extensions 76, and the extensions 76 may hold the gasket 74 in place when the threaded connection 53 is established.

Figure 7:
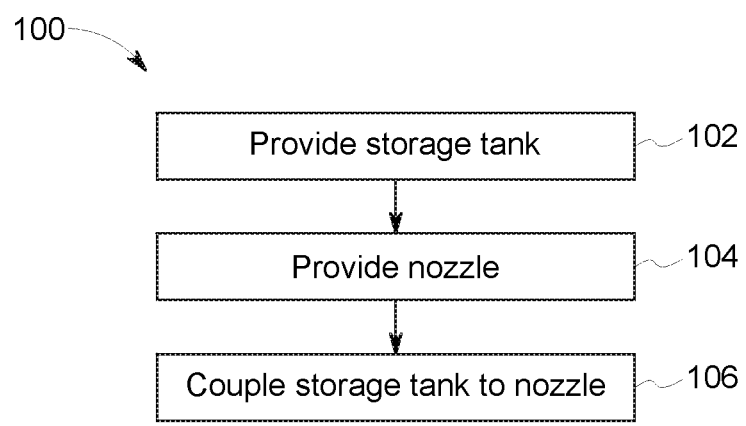
FIG. 7 is a flow chart of a method for securing a nozzle to a storage tank.

With the embodiments of FIGS. 3-6 in mind, FIG. 7 is a flow chart of a method 100 for securing the nozzle 54 to the storage tank 52. At block 102, the storage tank 52 is provided. As discussed above, the storage tank may be made from aluminum or a combination of materials that includes aluminum (e.g., aluminum and carbon fiber).

At block 104 the nozzle 54 is provided. As discussed above, the nozzle 54 may be made from a single material such as stainless steel. Additionally, the nozzle 54 may be bimetallic. More specifically, a first portion 66 of the nozzle 54 may be made from stainless steel, and a second portion 68 of the nozzle 54 may be made from aluminum.

At block 106, the storage tank 52 and nozzle 54 may be coupled to one another to form the connection 53 such that the leak rate associated with the storage tank 52, connection 53, and nozzle 54 is equal to or less than $1\times10^{-9}$ std. cc/s. For instance, the connection 53 may be formed by welding (e.g., friction welding or traditional welding techniques) the storage tank 52 and the nozzle 54 together, which would result in the configurations illustrated in FIG. 3 and FIG. 4. As another example, the storage tank 52 and nozzle 54 may be coupled to one another via a threaded connection 53 such that a leak rate equal to or less than $1\times10^{-9}$ std. cc/s is maintained. For example, as discussed above, the storage tank 52 may include extensions or threads 65 that interface with threads or extensions 67 of the nozzle 54 to form the threaded connection 53. Moreover, an adhesive or sealant (e.g., epoxy) may be included in the threaded connection 53.

Technical effects of the invention include systems and methods that enable a nozzle to be coupled to storage tank in such a manner that allows for the storage tank to be used in variety of applications that have different ranges of temperatures and pressures at which gas is stored. Furthermore, embodiments of the present disclosure allow for a low rate of gas leakage from the storage tank, which allows the storage tanks to be used in applications sensitive to gas leaks or certain gas leak rates such as magnetic resonance imaging and cryogenic applications.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A system comprising:
   a storage tank storing gas, wherein the storage tank comprises a storage tank neck and a storage tank interface both made from a first material, wherein the storage tank neck defines the storage tank interface, and wherein a channel is formed within the storage tank neck;
   a nozzle comprising a nozzle interface and a first portion, wherein the first portion is made from a second material different from the first material, wherein an inner portion is formed within the nozzle, and wherein the inner portion is aligned with the channel such that the inner portion and the channel are joined and in fluid communication with each other to form a passage for the gas to exit from the storage tank to the inner portion through the channel; and
   a friction weld connection formed by coupling the storage tank interface and the nozzle interface to one another, wherein the connection is configured to maintain a leak rate of the gas equal to or less than $1\times10^{-4}$ standard cubic centimeters per second (std. cc/s).

2. The system of claim 1, wherein the first material is aluminum, and the second material is stainless steel.

3. The system of claim 2, wherein the nozzle interface is made from the first material.

4. The system of claim 1, wherein the storage tank is made from the first material and a third material, wherein the third material comprises carbon fiber.

5. The system of claim 1, wherein the connection is configured to maintain the leak rate equal to or less than $1\times10^{-7}$ std. cc/s.

6. A system comprising:
   a storage tank storing gas, wherein the storage tank comprises a storage tank neck and a storage tank interface both made from a first material, wherein the storage tank neck defines the storage tank interface, and wherein a channel is formed within the storage tank neck; and a nozzle comprising a nozzle interface and a first portion, wherein the first portion is made from a second material different from the first material, wherein an inner portion is formed in the nozzle, and wherein the inner portion is aligned with the channel such that the inner portion and the channel are joined and in fluid communication with each other to form a passage for the gas to exit from the storage tank to the inner portion through the channel; and a connection formed by coupling the storage tank interface and the nozzle interface to one another, wherein the connection is configured to maintain a leak rate of the gas equal to or less than $1\times10^{-4}$ standard cubic centimeters per second (std. cc/s), wherein the connection comprises a threaded connection, wherein the system further comprises a gasket, wherein the gasket forms a seal between the storage tank and the nozzle.

7. The system of claim 6, comprising an epoxy disposed around and sealing the threaded connection.

8. A method comprising:
providing a storage tank storing gas, wherein the storage tank comprises a storage tank neck and a storage tank interface both made from a first material, wherein the storage tank neck defines the storage tank interface, and wherein a channel is formed within the storage tank neck; and providing a nozzle, wherein the nozzle comprises a nozzle interface and a first portion, wherein the first portion is made from a second material that is different from the first material, wherein an inner portion is formed within the nozzle, and wherein the inner portion is aligned with the channel such that the inner portion and the channel are joined and in fluid communication with each other to form a passage for the gas to exit from the storage tank to the inner portion through the channel; and frictionally welding the storage tank interface to the nozzle interface to form a connection such that a leak rate of the gas equal to or less than $1\times10^{-4}$ standard cubic centimeters per second (std. cc/s) is maintained.

9. The method of claim 8, wherein the connection is formed such that the leak rate is equal to or less than $1\times10^{-6}$ std. cc/s.

10. The method of claim 8, wherein the connection is formed such that the leak rate is equal to or less than $1\times10^{-9}$ std. cc/s.

11. The method of claim 8, wherein the first material is aluminum, and the second material is stainless steel.

12. The method of claim 8, wherein the storage tank is made of the first material and a third material.

13. A system comprising:
a storage tank storing gas, wherein the storage tank comprises a storage tank neck and a storage tank interface both made from a first material, wherein the storage tank neck defines the storage tank interface, and wherein a channel is formed within the storage tank neck;

a nozzle comprising a nozzle interface and a first portion, wherein the first portion is made from a second material different from the first material, wherein an inner portion is formed within the nozzle, and wherein the inner portion is aligned with the channel such that the inner portion and the channel are joined and in fluid communication with each other to form a passage for the gas to exit from the storage tank to the inner portion through the channel;

a connection formed by coupling the storage tank interface and the nozzle interface to one another, wherein the connection is configured to maintain a leak rate of the gas equal to or less than $1\times10^{-7}$ standard cubic centimeters per second (std. cc/s), wherein the connection comprises a friction weld; and a cooling system configured to receive the gas from the storage tank, wherein the cooling system is configured to use the gas to cool a superconducting unit.

14. The system of claim 13, comprising a connector, wherein the connector is configured to connect the nozzle to the cooling system and is made from the second material.

15. The system of claim 13, wherein the leak rate is equal to or less than $1\times10^{-10}$ std. cc/s.

* * * * *